United States Patent [19]

Oh

[11] Patent Number: 5,594,374

[45] Date of Patent: Jan. 14, 1997

[54] DATA OUTPUT BUFFER

[75] Inventor: Young N. Oh, Kyoungki-do, Rep. of Korea

[73] Assignee: Hyundai Electronics Industries Co. Ltd., Kyoungki-do, Rep. of Korea

[21] Appl. No.: 502,007

[22] Filed: Jul. 13, 1995

[30] Foreign Application Priority Data

Jul. 14, 1994 [KR] Rep. of Korea .................. 94-16974

[51] Int. Cl.[6] .................................................. H03K 5/12
[52] U.S. Cl. ................................................ 327/108; 327/170
[58] Field of Search ................................... 327/108, 170

[56] References Cited

U.S. PATENT DOCUMENTS

| 4,634,894 | 1/1987 | Shu et al. | 327/108 |
| 5,148,048 | 9/1992 | Kawasaki et al. | 327/170 |
| 5,191,245 | 3/1993 | Kang | 327/170 |

FOREIGN PATENT DOCUMENTS

| 000164615 | 12/1985 | European Pat. Off. | 327/108 |
| 360169221 | 9/1985 | Japan | 327/108 |

*Primary Examiner*—Margaret Rose Wambach
*Attorney, Agent, or Firm*—Gary M. Nath; Nath & Associates

[57] ABSTRACT

A data output buffer comprising a pull-up driver connected between a first voltage source and a data output line, for amplifying a first logic value of an input data signal, a pull-down driver connected between a second voltage source and the data output line, for amplifying a second logic value of the input data signal, a pull-down driver connection circuit connected between the pull-down driver and the second voltage source, for varying an impedance of the pull-down driver, and a pull-down driver control circuit for detecting whether the input data signal has its second logic value and generating a control signal in accordance with the detected result to control the operation of the pull-down driver connection circuit. According to the present invention, the data output buffer can control an amount of current flowing through the pull-down driver in a multi-step manner to minimize an impulse noise component in low logic output data on the data output line.

9 Claims, 5 Drawing Sheets

5,594,374

DATA OUTPUT BUFFER

BACKGROUND OF THE INVENTION

1. Field of the Invention

The present invention relates in general to a data output buffer used in a semiconductor memory device, and more particularly, to a data output buffer which is capable of minimizing an impulse noise component in output data on a data output line by controlling an amount of current flowing through a pull-down transistor according to a logic state of an input data signal from a memory cell when the output data on the data output line is low in logic.

2. Description of the Prior Art

A data output buffer of the present invention controlling an amount of current flowing through a pull-down transistor in a multi-step manner can be applied to all highly integrated circuits.

Referring to FIG. 1, there is shown an example of conventional data output buffers. In the case where output data on a data output line N3 is low in logic, a difference between a voltage on a node N2 and a ground voltage from a ground voltage source Vss becomes large, thereby causing a pull-down transistor Q2 to be turned on. As the pull-down transistor Q2 is turned on, a voltage on the data output line N3 is transferred to the ground voltage source Vss. At this time, an amount of current flowing through the pull-down transistor Q2 to the ground voltage source was instantaneously varies abruptly, resulting in the generation of a very high impulse noise component in the low logic output data on the data output line N3.

On the other hand, in the case where a control signal OE is high in logic and an input data signal DOb on a data input line is low in logic, a pull-up transistor Q1 is turned on, thereby causing the data output line N3 to maintain a high voltage corresponding to a supply voltage. When the input data signal DOb on the data input line goes from low to high in logic, the current flowing through the pull-down transistor Q2 is abruptly increased in amount because of the high voltage on the data output line 3. Namely, the noise component included in the output data on the data output line N3 varies more abruptly as the supply voltage is increased.

SUMMARY OF THE INVENTION

Therefore, the present invention has been made in view of the above problem, and it is an object of the present invention to provide a data output buffer for controlling an instantaneous current amount di/dt flowing through a pull-down driver to minimize an impulse noise component in output data on a data output line.

In accordance with the present invention, the above and other objects can be accomplished by providing a data output buffer comprising a pull-up driver connected between a first voltage source and a data output line, for amplifying a first logic value of an input data signal; a pull-down driver connected between a second voltage source and the data output line, for amplifying a second logic value of the input data signal; a pull-down driver connection circuit connected between the pull-down driver and the second voltage source, for varying an impedance of the pull-down driver; and a pull-down driver control circuit for detecting whether the input data signal has its second logic value and generating a control signal in accordance with the detected result to control the operation of the pull-down driver connection circuit.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
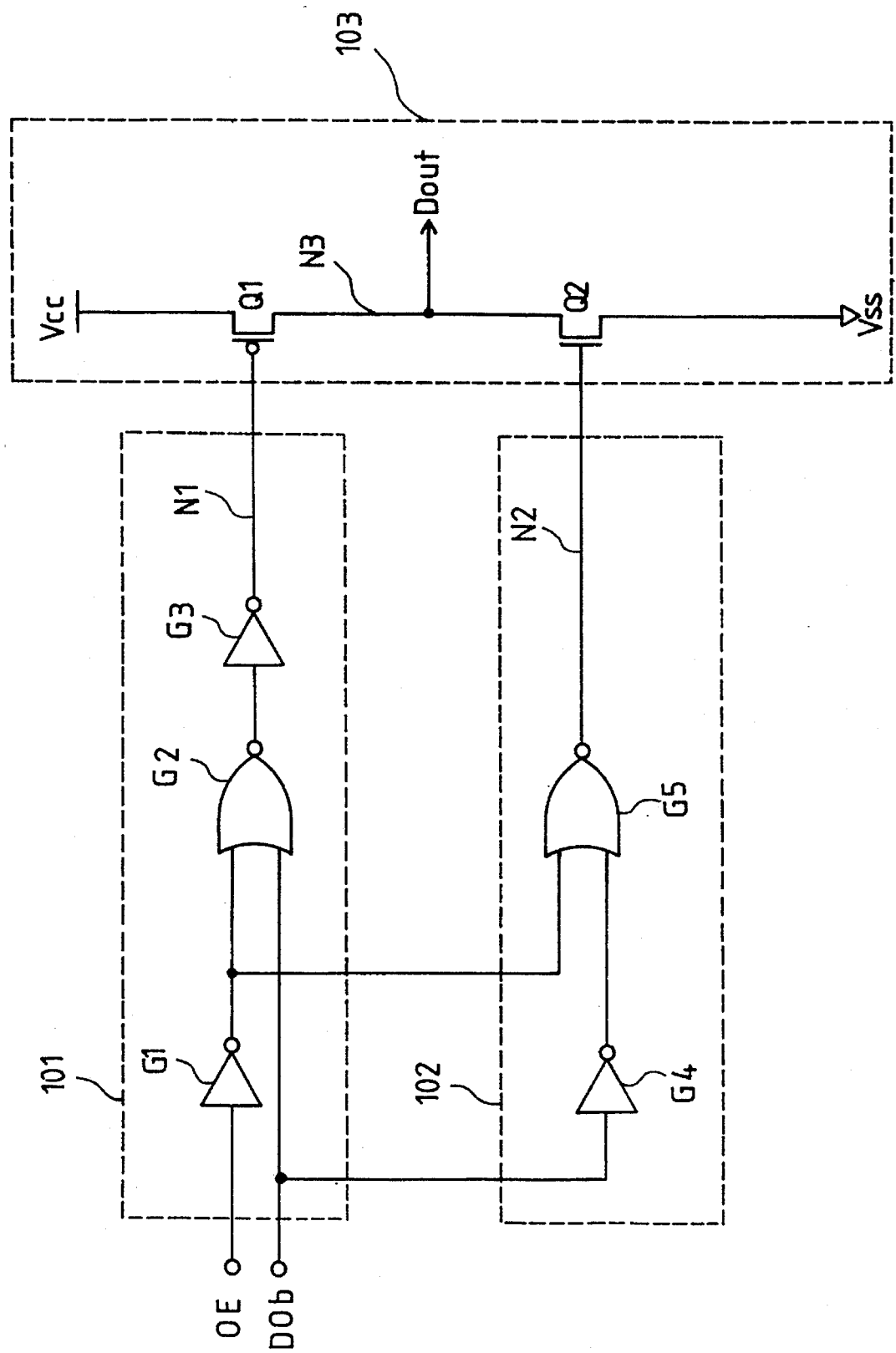
FIG. 1 is a circuit diagram of a conventional data output buffer.
Figure 2:
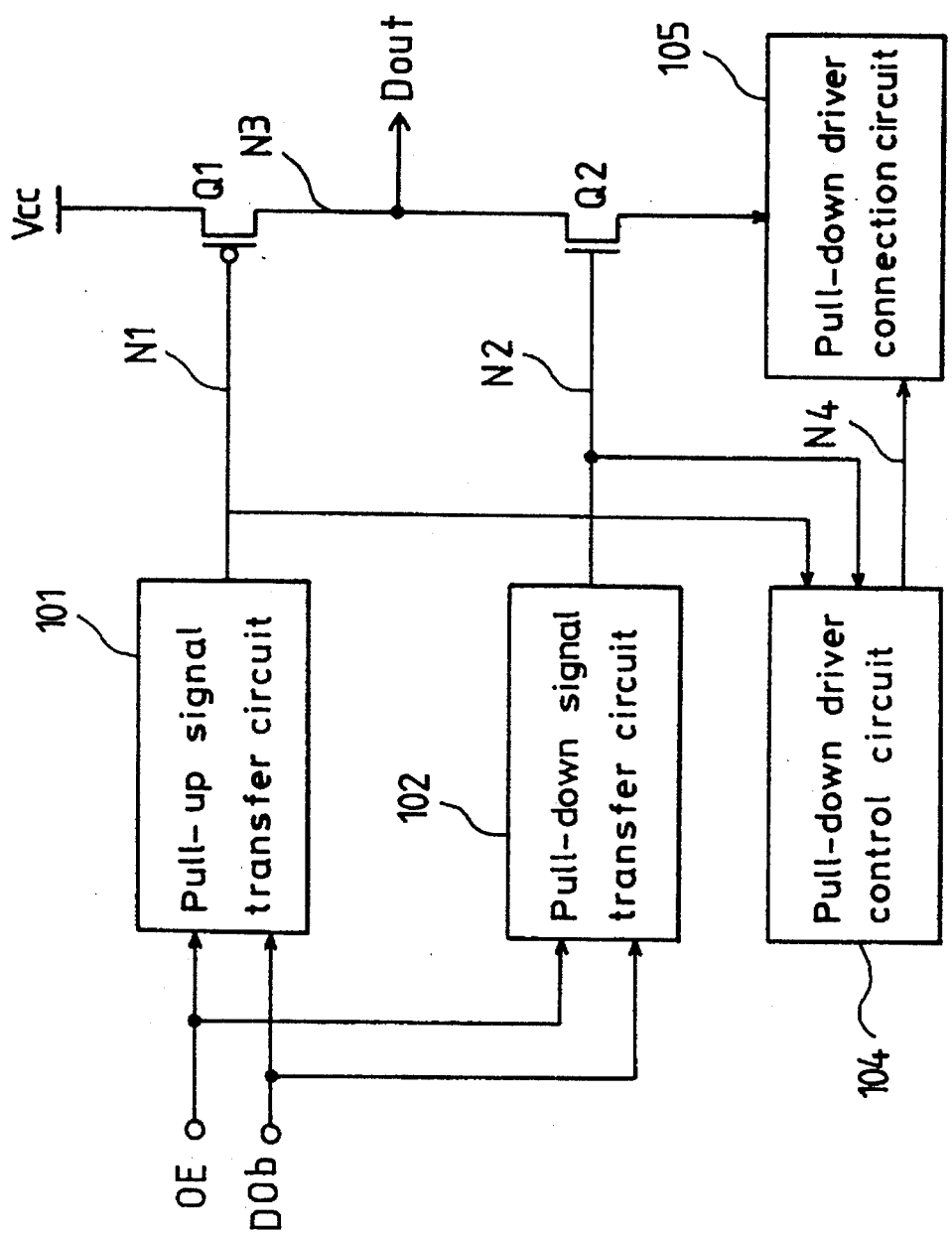
FIG. 2 is a block diagram of a data output buffer in accordance with an embodiment of the present invention.

Referring to FIG. 2, there is shown a block diagram of a data output buffer in accordance with an embodiment of the present invention. Some parts in this drawing are the same as those in FIG. 1. Therefore, like reference numerals designate like parts. As shown in this drawing, the data output buffer comprises a pull down driver connection circuit 105 and a pull-down driver control circuit 104 in addition to the construction of the conventional data output buffer in FIG. 1. The pull-down driver control circuit 104 is adapted to control the pull-down driver connection circuit 105.

The pull-down driver connection circuit 105 is connected between the pull-down transistor Q2 and the ground voltage source Vss to make a variation in the current amount through the pull-down transistor Q2 gentle. The pull-down driver control circuit 104 is adapted to control the pull-down driver connection circuit 105 in response to logic states of the control signal OE and the input data signal DOb.

Figure 3:
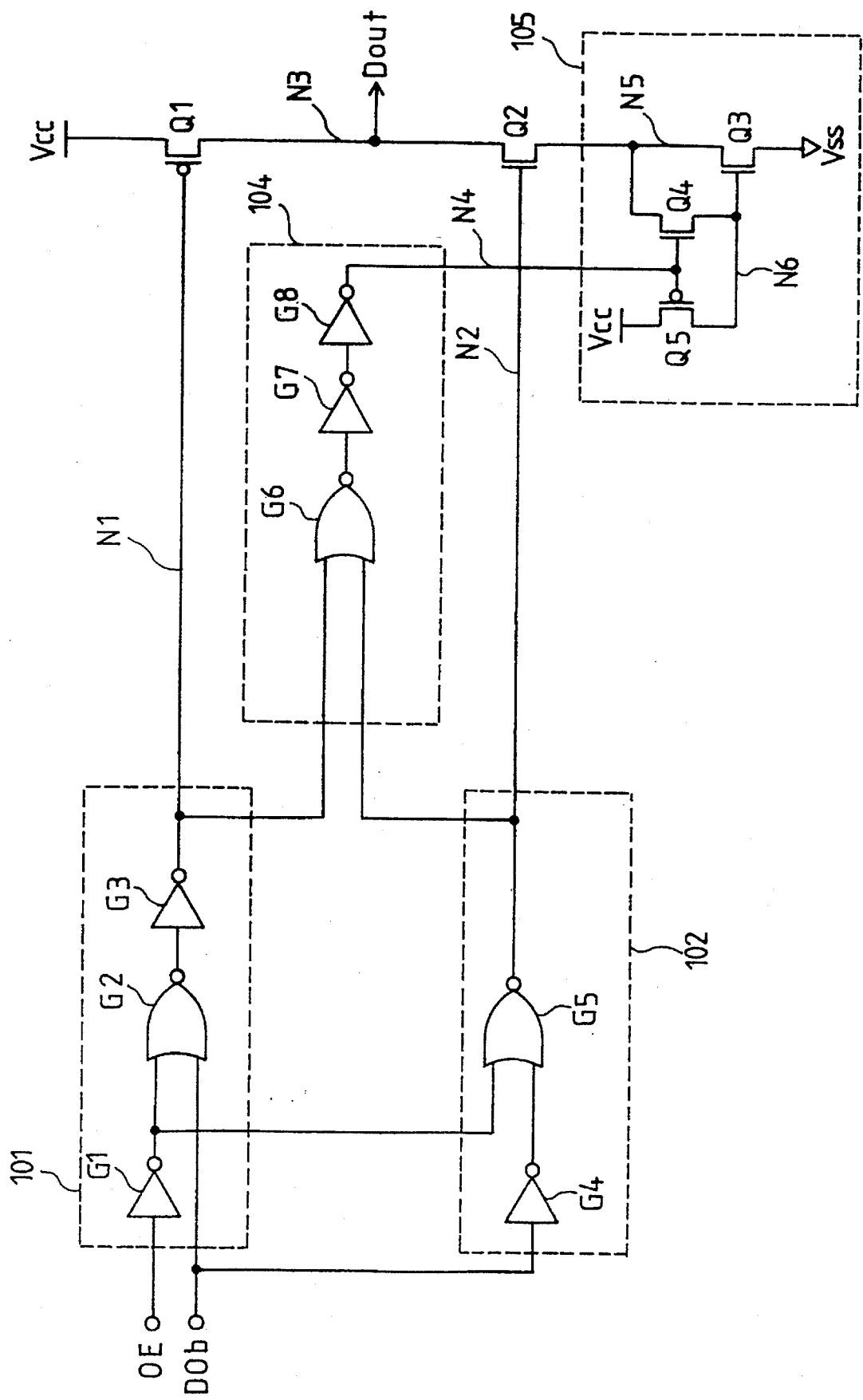
FIG. 3 is a detailed circuit diagram of the data output buffer in FIG. 2.

FIG. 3 is a detailed circuit diagram of the data output buffer in FIG. 2. The operation of the data output buffer with the above mentioned construction in accordance with the embodiment of the present invention will hereinafter be described in detail with reference to FIGS. 2 and 3.

When the control signal OE is high in logic and the input data signal DOb from a memory cell (not shown) is low in logic, a pull-up signal transfer circuit 101 generates a low logic signal on a node N1. To this end, the pull-up signal transfer circuit 101 includes an inverter G1 for inverting the control signal OE, a NOR gate G2 for NORing an output signal from the inverter G1 and the input data signal DOb, and an inverter G3 for inverting an output signal from the NOR gate G2. The pull-up transistor Q1 is turned on in response to the low logic signal on the node N1 to generate high logic output data Dout on the data output line N3.

A pull-down signal transfer circuit 102 includes an inverter G4 for inverting the input data signal DOb, and a NOR gate G5 for NORing an output signal from the inverter G4 and the output signal from the inverter G1 in the pull-up signal transfer circuit 101. When the control signal OE is high in logic and the input data signal DOb is high in logic, the pull-down signal transfer circuit 102 generates a high logic signal on the node N2. The pull-down transistor Q2 is turned on in response to the high logic signal on the node N2 to generate low logic output data Dout on the data output line N3.

The pull-down driver control circuit 104 includes a NOR gate G6 for NORing the logic signals on the nodes N1 and N2, and an inverter series circuit for delaying an output signal from the NOR gate G6 for a predetermined time period and supplying the delayed signal to the pull-down driver connection circuit 105 through a node N4. The inverter series circuit is provided with two inverters G7 and G8. Under the condition that the control signal OE remains at its high logic state, the pull-down driver control circuit 104 generates a logic signal on the node N4 by delaying the input data signal DOb by propagation delay times of the NOR gate G5 and two inverters G7 and G8 and inverting the delayed signal in logic.

The pull-down driver connection circuit 105 includes an NMOS transistor Q4 and a PMOS transistor Q5 being driven complimentarily to each other in response to the logic signal on the node N4. In a standby mode in which the control signal OE is low in logic, the logic signal on the node N4 becomes low in logic because the logic signals on the nodes N1 and N2 have their different logic states. In this case, the PMOS transistor Q5 is turned on in response to the low logic signal on the node N4 to transfer a supply voltage from a supply voltage source Vcc to a gate of an NMOS transistor Q3 connected between the pull-down transistor Q2 and the ground voltage source Vss. As a result, the NMOS transistor Q3 is driven in response to the supply voltage from the supply voltage source Vcc to allow a large amount of current to be passed to the ground voltage source Vss through the pull-down transistor Q2 and a node N5.

On the other hand, in an active mode in which the control signal OE is high in logic, the logic signal on the node N4 has the opposite logic state to that of the input data signal DOb and a waveform which is delayed by a predetermined time period from the input data signal DOb. Namely, when the input data signal DOb is changed from high to low in logic, the logic signal on the node N4 is changed from low to high in logic after the lapse of the predetermined time period from a falling edge of the input data signal DOb. On the contrary, when the input data signal DOb is changed from low to high in logic, the logic signal on the node N4 is changed from high to low in logic after the lapse of the predetermined time period from a rising edge of the input data signal DOb.

As mentioned above, the pull-down driver connection circuit 105 includes the NMOS transistors Q3 and Q4 and the PMOS transistor Q5. The NMOS transistor Q3 is connected between the node N5 and the ground voltage source Vss. The NMOS transistor Q4 is connected between the node N5 and a node N6 which is connected to the gate of the NMOS transistor Q3. The PMOS transistor Q5 is connected between the supply voltage source Vcc and the gate of the NMOS transistor Q3. When the logic signal on the node N4 is high in logic, the NMOS transistor Q4 is turned on to supply a varying voltage Vss+Vtn from the node N5 to the node N6. Noticeably, the NMOS transistor Q4 is turned off after the lapse of a predetermined time period from the turning-on of the pull-down transistor Q2. At this time, the varying voltage Vss+Vtn on the node N5 has a linear characteristic in that it is increased from the ground voltage Vss to a predetermined voltage (for example, supply voltage Vcc/2) and then reduced to the ground voltage Vss.

On the contrary, in the case where the logic signal on the node N4 is low in logic, the PMOS transistor Q5 is turned on to transfer the supply voltage from the supply voltage source Vcc to the node N6. Noticeably, the PMOS transistor Q5 is turned on after the lapse of the predetermined time period from the turning-on of the pull-down transistor Q2.

For example, in the case where the output data on the data output line N3 is low in logic, the logic signal on the node Nd remains at its high logic state in response to the previous input data signal DOb. Also, the NMOS transistor Q4 remains at its ON state, whereas the PMOS transistor Q5 remains at its OFF state. The pull-down transistor Q2 is turned on in response to the logic signal on the node N2 being high in logic, thereby causing current from the data output line N3 to abruptly flow to the node N5. At this time, the varying voltage Vss+Vtn on the node N5 begins to be increased from the ground voltage Vss. It should be noted that the high logic signal on the node N2 results from the present input data signal DOb. The varying voltage Vss+Vtn ion the node N5 is transferred to the gate of the NMOS transistor Q3 through the NMOS transistor Q4 and the node N6. In response to the varying voltage Vss+Vtn on the node N5, the NMOS transistor Q3 allows an amount of current flowing from the node N5 to the ground voltage source Vss to be slowly increased. As a result, an amount of current flowing from the data output line N3 to the ground voltage source Vss and the varying voltage Vss+Vtn on the node N5 are gently increased and then slowly reduced. In result, the voltage on the data output line N3 is discharged at a gradually increasing speed and then at a gradually decreasing speed.

When the logic signal on the node N4 is changed from high to low in logic in response to the present input data signal DOb, the NMOS transistor Q4 is turned off, whereas the PMOS transistor Q5 is turned on. As being turned on, the PMOS transistor Q5 transfers the supply voltage from the supply voltage source Vcc to the gate of the NMOS transistor Q3 through the node N6. At this time, the NMOS transistor Q3 is driven in response to the supply voltage from the supply voltage source Vcc to make a current path from the node N5 to the ground voltage source Vss large, so that the remaining voltage on the data output line N3 can be fully discharged. In this manner, a minimized impulse noise component can be present in the low logic output data on the data output line N3.

Figure 4:
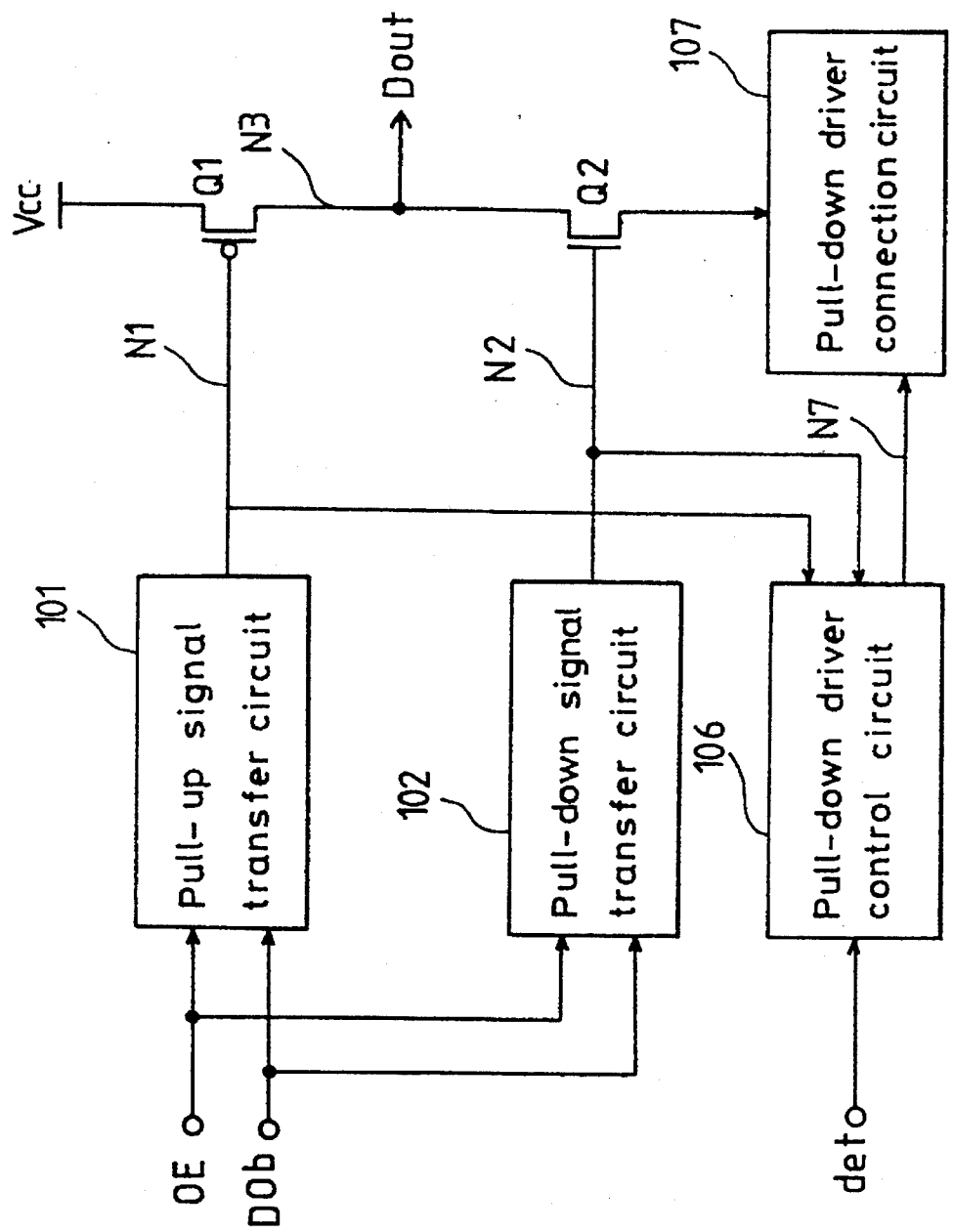
FIG. 4 is a block diagram of a data output buffer in accordance with an alternative embodiment of the present invention.

Referring to FIG. 4, there is shown a block diagram of a data output buffer in accordance with an alternative embodiment of the present invention. The construction of the second embodiment in FIG. 4 is substantially the same as that of the first embodiment in FIG. 2, with the exception that a voltage detect signal det from a voltage detector (not shown) is additionally supplied to a pull-down driver control circuit 106.

Figure 5:
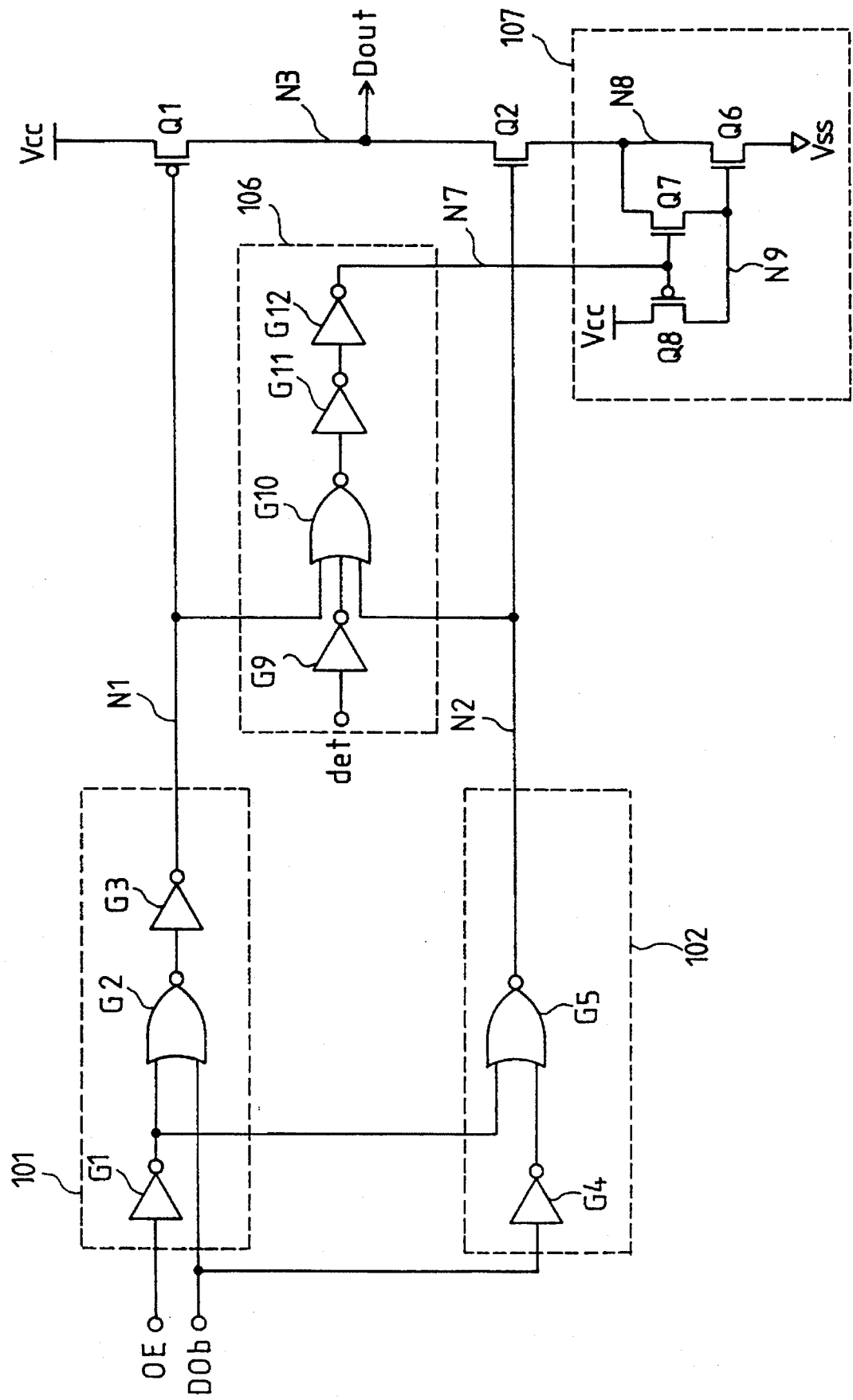
FIG. 5 is a detailed circuit diagram of the data output buffer in FIG. 4.

The operation of the data output buffer with the above-mentioned construction in accordance with the alternative embodiment of the present invention will hereinafter be described in detail with reference to FIG. 5 which is a detailed circuit diagram of the data output buffer in FIG. 4.

In the case where the supply voltage is low, the voltage on the data output line N3 is slowly discharged through the sequential steps in the same manner as that in FIG. 3, resulting in a reduction in the data output speed. In order to prevent such a reduction in the data output speed, the voltage detect signal det from the voltage detector remains at its low logic state.

In this case, the pull-down driver control circuit 106 generates a low logic signal and supplies the generated low logic signal to a pull-down driver connection circuit 107 through a node N7. To this end, the pull-down drier control circuit 106 includes an inverter C9 for inverting the voltage detect signal det from the voltage detector, a NOR gate G10 for NORing the logic signal on the node N1 which is the output signal for the pull-up signal transfer circuit 101, the logic signal on the node N2 which is the output signal from the pull-down signal transfer circuit 102 and an output signal for the inverter G9, and an inverter series circuit for delaying an output signal from the NOR gate G10 for a predetermined time period and supplying the delayed signal to the pull-down driver connection circuit 107 through the node N7. The inverter series circuit is provided with two inverters G11 and G12.

When the logic signal on the node N7 is low in logic, the pull-down driver connection circuit 107 makes a current path between the data output line N3 and the ground voltage source Vss large to the maximum. Namely, an impedance between the data output line N3 and the ground voltage source Vss becomes the minimum, for this reason, the voltage on the data output line N3 tis rapidly discharged to the ground voltage source Vss. To this end, the pull-down driver connection circuit 107 includes an NMOS transistor Q6 connected between a node N8, which is connected to the pull-down transistor Q2, and the ground voltage source Vss, an NMOS transistor Q7 connected between the node N8 and a node N9 connected to a gate of the NMOS transistor Q6, and a PMOS transistor Q3 connected between the supply voltage source Vcc and the gate of the NMOS transistor Q6.

In the case where the logic signal on the node N7 is low in logic, the NMOS transistor Q7 is turned off, whereas the PMOS transistor Q8 is turned on. As being turned on, the PMOS transistor Q8 transfers the supply voltage from the supply voltage source Vcc to the gate of the NMOS transistor Q6 through the node N9. At this time, the NMOS transistor Q6 is driven in response to the supply voltage from the supply voltage source Vcc in such a manner that the voltage on the data output line N3 can be rapidly discharged to the ground voltage source Vss through the pull-down transistor Q2 and the node N8.

As apparent for the above description, according to the present invention, the data output buffer can control the amount of current flowing through the pull-down transistor to the ground voltage source in the multi-step manner to minimize the impulse noise component in the low logic output data. Also, the data output buffer of the present invention can control the amount of current flowing through the pull-down transistor to the ground voltage source in response to the supply voltage. Therefore, the data output buffer of the present invention has the effect of performing the high-speed operation even when the supply voltage is low.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer comprising:
    a pull-up signal transfer circuit for generating a first logic value of an input data signal in accordance with a data output buffer control signal;
    a pull-down signal transfer circuit for generating a second logic value of said input data signal in accordance with said data output buffer control signal;
    a pull-up driver connected between a first voltage source and a data output line, for amplifying the first logic value of said input data signal;
    a pull-down driver connected between a second voltage source and said data output line, fir amplifying the second logic value of said input data signal;
    a pull-down driver control circuit for generating a control signal in accordance with said first logic value and said second logic value; and
    a pull-down driver connection circuit connected between said pull-down driver and said second voltage source, for varying an impedance of said pull-down driver in respond to said control signal.

2. A data output buffer as set forth in claim 1, wherein said first logic value of said input data signal is low and said second logic value of said input data signal is high.

3. A data output buffer as set forth in claim 1, wherein said first voltage source generates a high voltage and said second voltage source generates a low voltage.

4. A data output buffer as set forth in claim 1, wherein said pull-down driver connection circuit includes:
    a first NMOS transistor connected between a first node and said second voltage source, said first node being connected to said pull-down driver;
    a second NMOS transistor connected between said first node and a second node, said second node being connected to a gate of said first NMOS transistor; and
    a PMOS transistor connected between said first voltage source and said second node, said PMOS transistor being driven complimentarily to said second NMOS transistor in response to an output signal from said pull-down driver control circuit.

5. A data output buffer as set forth in claim 1, wherein said pull-down driver control circuit includes an inverter chain for inverting said first or second logic value of said input data signal and delaying the resultant signal for a predetermined time period.

6. A data output buffer as set forth in claim 5, wherein said pull-down driver control circuit further includes a switch for switching said input data signal to said inverter chain in response to an output enable signal.

7. A data output buffer as set forth in claim 6, wherein said inverter chain includes an even number of inverters and said switch is a NOR gate.

8. A data output buffer as set forth in claim 1, wherein said pull-down driver control circuit further inputs a voltage detect signal, said voltage detect signal having a logic value depending on a difference between voltages from said first and second voltage sources, said pull-down driver control circuit selectively driving said pull-down driver connection circuit in response to the logic values of said voltage detect signal and said input data signal.

9. A data output buffer as set forth in claim 8, wherein said pull-down driver control circuit includes:
    a NOR gate for NORing said input data signal and said voltage detect signal; and
    an inverter chain for delaying an output signal from said NOR gate for a predetermined time period and transferring the delayed signal to said pull-down driver connection circuit.

* * * * *